(12) United States Patent
Schmidberger

(10) Patent No.: US 8,706,998 B2
(45) Date of Patent: Apr. 22, 2014

(54) METHOD FOR MANAGING FLASH MEMORIES HAVING MIXED MEMORY TYPES

(75) Inventor: Franz Schmidberger, Constance (DE)

(73) Assignee: Hyperstone GmbH, Constance (DE)

( * ) Notice: Subject to any disclaimer, the term of this patent is extended or adjusted under 35 U.S.C. 154(b) by 180 days.

(21) Appl. No.: 13/202,332

(22) PCT Filed: Feb. 26, 2009

(86) PCT No.: PCT/DE2009/075011
§ 371 (c)(1),
(2), (4) Date: Aug. 19, 2011

(87) PCT Pub. No.: WO2010/097065
PCT Pub. Date: Sep. 2, 2010

(65) Prior Publication Data
US 2011/0302359 A1 Dec. 8, 2011

(51) Int. Cl.
*G06F 12/02* (2006.01)

(52) U.S. Cl.
USPC ........... 711/165; 711/103; 711/154; 711/158; 711/E12.008

(58) Field of Classification Search
USPC ................. 711/165, 103, 154, 158, E12.008
See application file for complete search history.

(56) References Cited

U.S. PATENT DOCUMENTS

| | | | |
|---|---|---|---|
| 7,752,382 B2 | 7/2010 | Lasser et al. | |
| 2007/0204128 A1* | 8/2007 | Lee et al. | 711/173 |
| 2008/0140918 A1 | 6/2008 | Sutardja | |
| 2008/0209112 A1 | 8/2008 | Yu et al. | |
| 2008/0215800 A1* | 9/2008 | Lee et al. | 711/103 |

FOREIGN PATENT DOCUMENTS

WO 2007/029259 A2 3/2007

* cited by examiner

*Primary Examiner* — Yong Choe
(74) *Attorney, Agent, or Firm* — Laurence A. Greenberg; Werner H. Stemer; Ralph E. Locher

(57) ABSTRACT

A method manages a flash memory having a plurality of physical blocks. The blocks of the memory are addressed by logic block addresses which are converted into physical block addresses. In each block a deletion counter is run in which the number of deletions of the block is counted, and two regions having different types of flash chips are present. A first region contains single-level flash chips with a large maximum deletion frequency, and a second region contains multi-level flash chips with a lower maximum deletion frequency. When writing to the memory the address conversion of the logic addresses into physical addresses is carried out such that all blocks of the first region are written, when all blocks of the first region have been written and a further writing process is initiated, the block in the first region having the lowest deletion counter is copied into a blank block in the second region.

13 Claims, 6 Drawing Sheets

METHOD FOR MANAGING FLASH MEMORIES HAVING MIXED MEMORY TYPES

BACKGROUND OF THE INVENTION

Field of the Invention

The invention relates to a method for managing a memory having multiple flash chips, which are organized in a plurality of physical blocks that can be deleted separately, said blocks having a limited maximum deletion frequency, the blocks of the memory being addressed by way of logic block addresses which are converted into physical block addresses by way of an address table, wherein in each block, a deletion counter is run.

Storage systems, which are composed of flash chips, especially so-called Solid State Disks, become more and more important and there is a need to offer them cheaply.

Two different types of flash chips are used. Single-level cell chips SLC offer a large number of possible write/deletion cycles, but are relatively expensive. Multi-level cell chips MLC are much cheaper, but offer a much smaller number of possible write/deletion cycles. Flash chips are organized in a plurality of real blocks that can be deleted separately. The blocks are addressed by the computer system by way of logic block addresses. When using a memory in a computer system, some data is changed frequently, while other data, such as application programs, are overwritten only very rarely. So it is desirable to store the rarely changed data in the cheap flash chips and to reserve the expensive flash chips for the frequently changed data.

Wear-leveling-methods are used in flash memories to achieve a uniform distribution of the necessary write/deletion cycles on all blocks and thus to maximize the lifetime of the memory. For this purpose, logic block addresses are converted into physical block addresses by way of an address table, and this allocation is changed according to the deletion frequency of the blocks.

BRIEF SUMMARY OF THE INVENTION

It is the object of the invention to disclose a method that allows to combine in one memory two types of flash chips with different maximum possible write/deletion cycles and to achieve a maximum lifetime of the memory.

This problem is solved by a method for managing a flash memory having a plurality of flash chips which are organized in a plurality of physical blocks that can be deleted separately. The blocks have a limited maximum deletion frequency. The blocks of the memory are addressed by way of logic block addresses which are converted into physical block addresses by way of an address table and in each block a deletion counter is run in which the number of deletions of the block is counted. The memory has two regions with different types of flash chips. A first region contains single-level flash chips with a large maximum deletion frequency. A second region contains multi-level flash chips with a lower maximum deletion frequency. When writing to the memory, the address conversion of the logic addresses into physical addresses is initially carried out such that all blocks of the first region are written. When all blocks of the first region have been written and a further write process is to be carried out, the block in the first region with the lowest deletion counter is copied into a blank block in the second region. In the address table, the physical block addresses assigned to the logic block addresses of these blocks are switched, and the block in the first region is deleted. This block is then written with the new data.

The storage system includes a memory controller with a firmware in which the method is performed. All Flash memory chips are connected to the controller and managed by it. The memory according to the invention is divided into two regions, the first of which is equipped with the single-level cell chips SLC, while the second region consists of multi-level cell chips MLC. Typically, the size of the second region is a multiple of that of the first region, but any relation is possible. The size of the separately deleteable real blocks can be different in the two flash types. In order to perform the method in both regions in the same way, physical blocks are formed by the firmware that have a fixed size and can consist of different numbers of real blocks in the two regions.

In the address conversion table a physical block address of a memory block is allocated for each logic block address. The host computer system uses the logic block addresses completely randomly.

In a starting phase the method provides that, when a physical address in the second region is accessed via the logic block address, a physical block address of a free memory block from the first region is then allocated to this logic block address in the address table. Thus, the first region is filled in the starting phase.

A deletion counter is assigned to each block that is incremented with each write/deletion cycle. When there is no free region left in the first block and a further write operation is run, a block with the lowest value of the deletion counter is searched in the first region and then copied to the second region. The physical block addresses for the assigned logic block addresses in the address table are switched. The block in the first region is deleted and written with the new data.

When all blocks of the first or second region are filled, the normal operation of memory management is started. By means of a wear-leveling method, the regions of the memory are evenly used according to their deletion frequency and the lifetime of all flash memory chips of the entire memory is maximized.

Deleted buffer blocks in both regions are designated for the wear-leveling method, to which new data is written, for blocks that have already been written. After the buffer block has been written completely, its physical address is entered in the address table for the used logic block address instead of the previously addressed physical block, and the latter is deleted. In this process, its deletion counter is incremented.

A wear-level threshold is defined for each region, which is higher for the first region and lower for the second region. Also, for each block a wear-level class counter is run. Each time the deletion counter is incremented, it is checked as to whether its value is equal to the wear-level threshold valid for this block. If this is the case, the wear-level class counter is incremented and the deletion counter is reset to the value of 0. When searching a new buffer block for re-writing a block in the same region of the memory is selected, with a low value in its wear-level class. In this way, a uniform deletion frequency of blocks within a region is achieved.

If the value of the wear-level class counter of a block within the first region is low or the value of the wear-level class counter of a block within the second region is high, its content can be moved to the respectively other region. For this purpose, a downward threshold that indicates the currently highest value of the wear-level class counters in the second region, and an upward threshold that indicates the currently lowest value of the wear-level class counters in the first region, are determined. Now, if the wear-level class counter in the first region is incremented to a value below the downward threshold, a buffer block in the second region is searched. Likewise, if the wear-level class counter in the second region is incremented to a value above the upward threshold, a buffer block in the first region is searched. In this way, a deletion frequency is achieved, which is adapted to the characteristics of the types of flash chips used, for the blocks within the entire memory. The lifetime of all flash chips of the entire memory is maximized.

In the described method, the reliability of the remaining flash chips is also checked. For this purpose, when writing data, an error correction word is formed across the data and stored within the block, and also a parity word is formed across the content of the block, and stored. If then one or more errors are detected while reading the data, they are corrected by means of the error correction word and checked again using the parity word. When the number of errors comes near the error correction capabilities of the storage system (e.g., four or more bit errors for a correction capability of the memory of 6 bit errors), this is a sign of the declining reliability of memory, and an "extraordinary" wear-level process it is performed on the block, if the block is currently open for writing, the block is flagged for such a wear-level process. It is dealt with once the block is closed. This way, all data, which are currently stored with correctable multi-bit errors, are copied to another, yet most rarely deleted, block and therefore subjected to a refresh. Thus, in particular those read errors are avoided, which are due to environment- and data-factors.

Furthermore, a maximum of permitted deletions of the memory is set for the first and the second region of the block. When the current value of an incremented wear-level class counter exceeds the predetermined maximum value, a warning is issued. This warning can be evaluated by the computer system using known methods.

Embodiments of the invention are exemplified in the figures.

DESCRIPTION OF THE INVENTION

Figure 1:
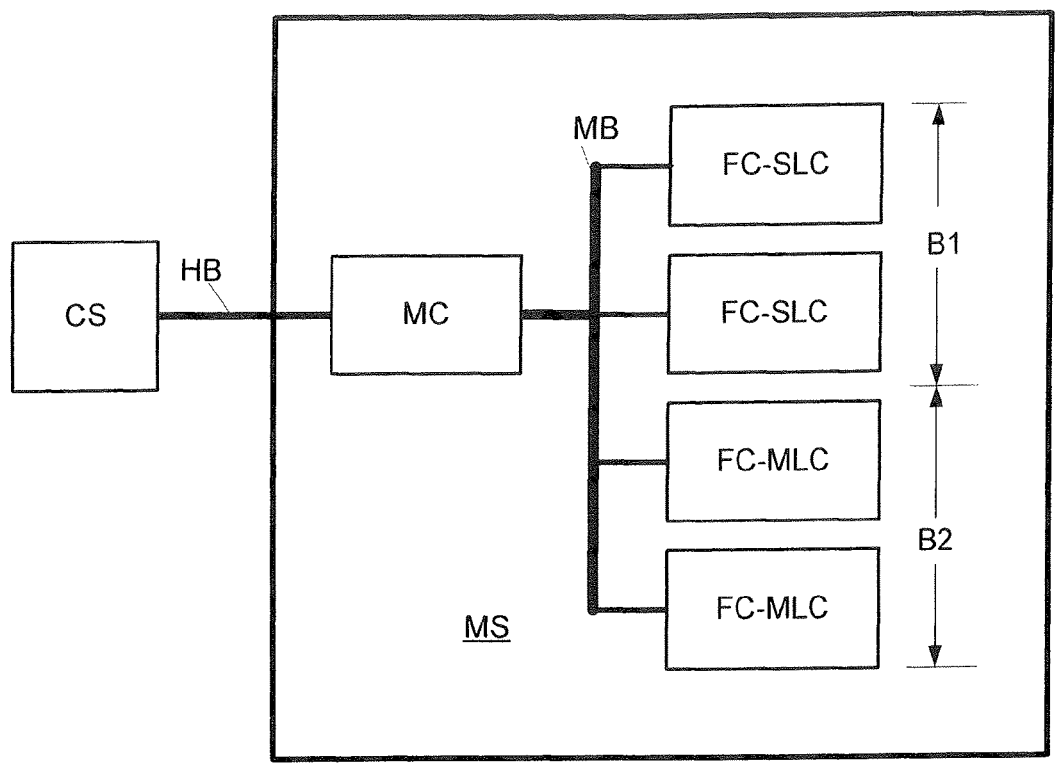
FIG. 1 shows a block diagram of a flash memory system.

FIG. 1 shows the memory system MS with the memory controller MC, which is connected via a host bus HB to the controlling computer system CS. The flash chips FC are connected to the memory controller MC via the memory bus MB, which form the data storage. There are two types of flash chips FC, with the FC-SLC SLC chips assigned to the first region B1 and the MLC-chips FC-MLC assigned to the second region. The SLC-chips FC-SLC have a much higher maximum deletion frequency compared to the MLC-chips MLC-FC.

Figure 2:
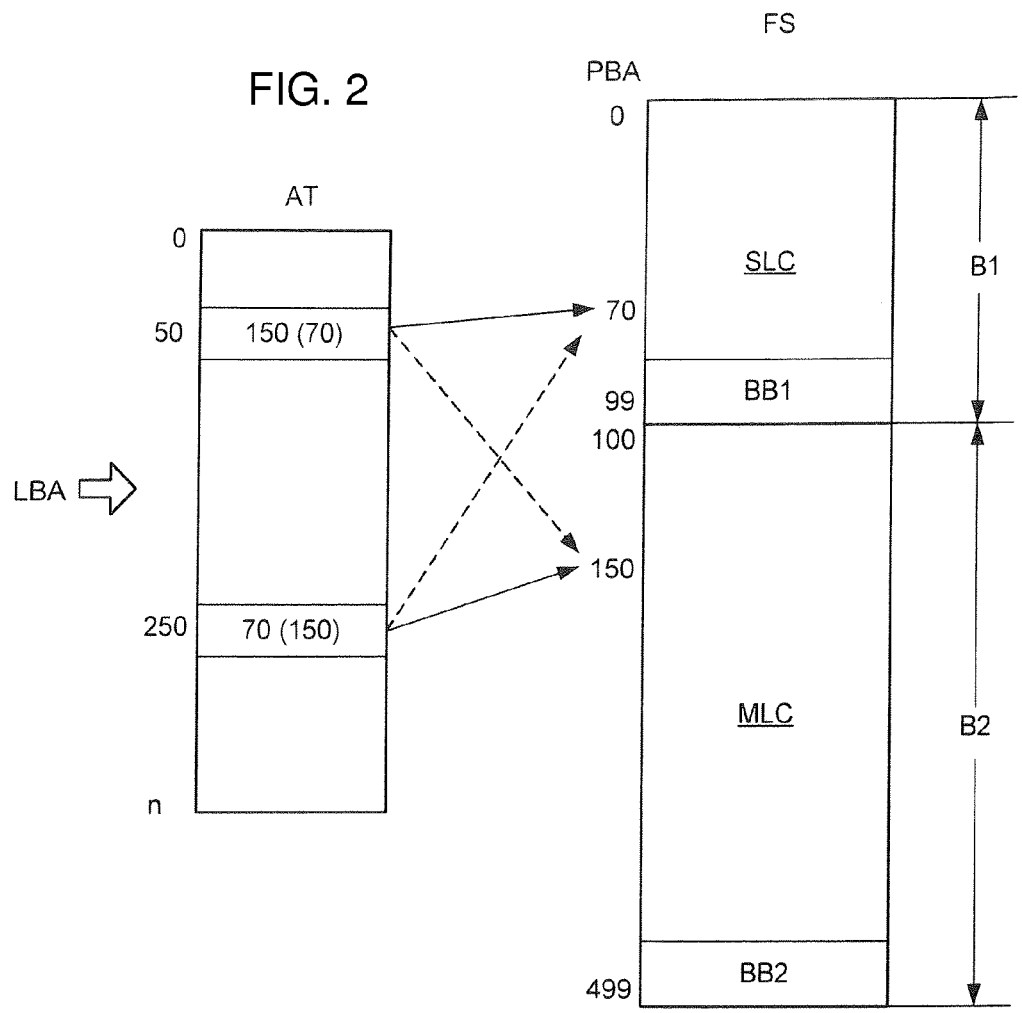
FIG. 2 shows the address allocation to the regions in the flash memory.

FIG. 2 shows the address table AT and the flash memory FS with the two regions B1 and B2. The logic block address LBA specified by the computer system is converted into a corresponding physical block address PBA. Here, the logic block address LBA is used as an index to the address table AT.

In the example shown here, the flash memory FS consists of 500 blocks with the physical block addresses PBA from 0 to 499. The first region B1 contains 100 blocks of the type SLC and the second region B2 contains 400 blocks of the type MLC. In each region, buffer blocks BB1, BB2 are provided for write operations.

In the example shown here, the logic block address 50 first indicates block 150 in the MLC region, while block 70 in the SLC region is assigned to the logic block address 250. Then, during a write operation to the logic block address 50, a block in the SLC region is searched, the deletion counter of which has a low value. In the example, this is the case for block 70, which assigned to the logic block address 250. In order to run the write operation in the SLC region, the physical block addresses in the address table AT are switched. Now, the logic block address 50 indicates block 70 in the SLC region and the logic block address 250 indicates block 150.

Figure 3:
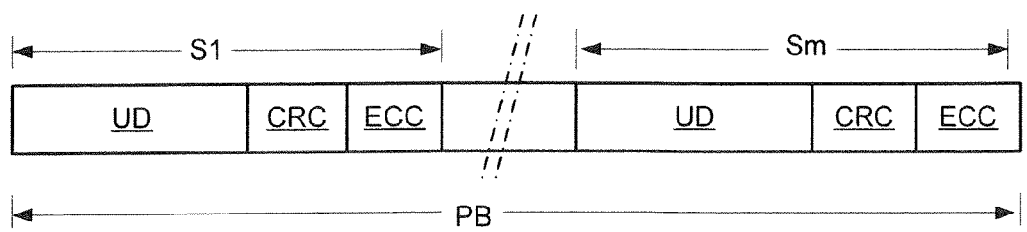
FIG. 3 shows the construction of a physical block.

FIG. 3 shows the construction of a physical block PB. It is divided into the sectors S1 to Sm, which each contain the user data UD, a parity word CRC and the error correction word ECC. In addition, for each physical block PB, there is one entry in the block management table that contains the deletion counter EC and the indication of the wear-level class WLC. The wear-level class WLC can also be formed by the upper part of the deletion counter EC.

Figure 4:
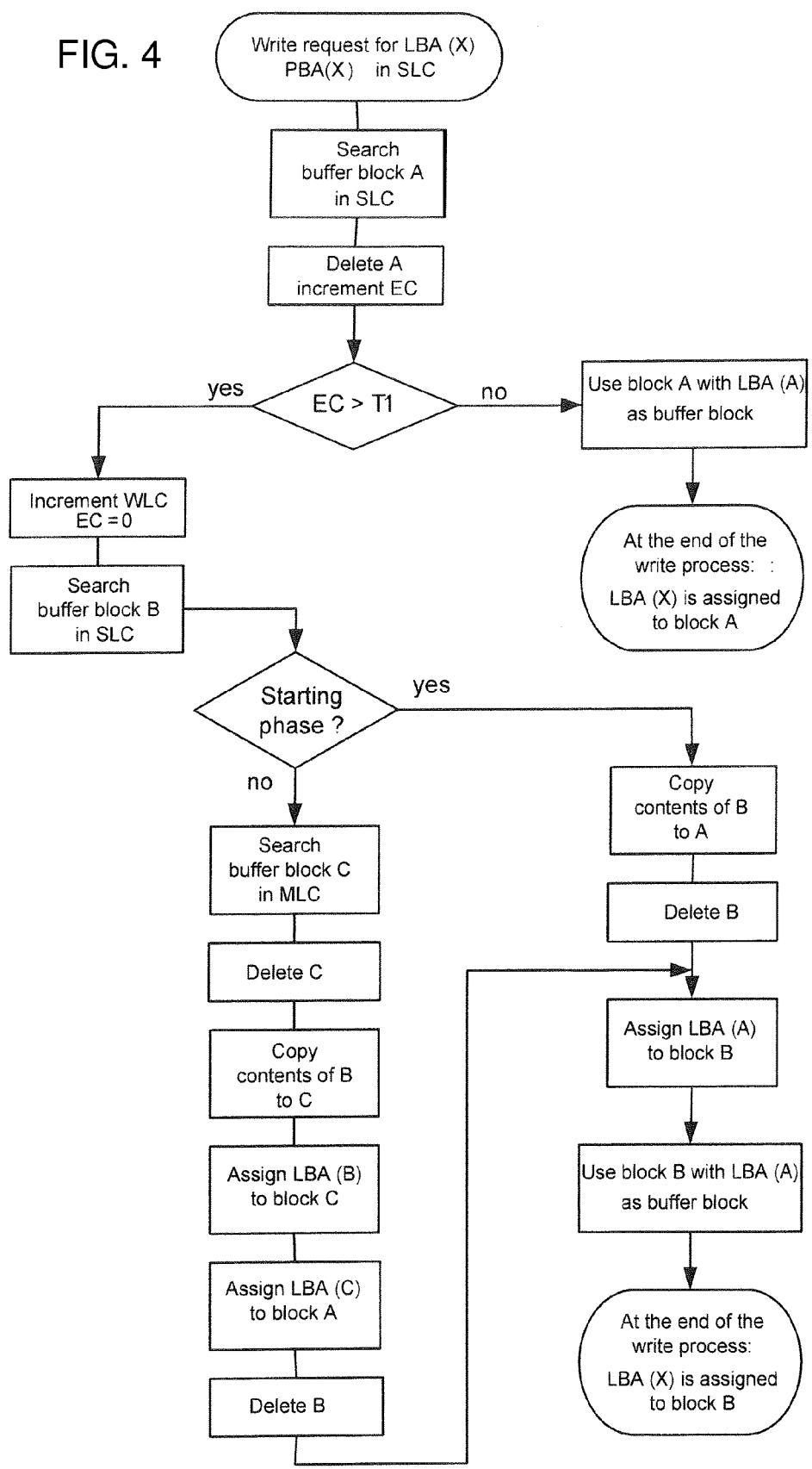
FIG. 4 shows the wear-leveling in the memory.

FIG. 4 shows the wear-leveling process of the memory. During a write request for the logic block X, the logic block address LBA (X) indicates the physical block address PBA (X) in the SLC region. There, a buffer block A is searched and deleted. In this process the deletion counter EC is incremented. If the deletion counter of A does not exceed the threshold T1 for an incrementation of the wear-level class, block A is used as a buffer block and the logic block address (X) is assigned to block A. When the deletion counter of A exceeds the threshold T1 for increasing the wear-level class, it is incremented and the deletion counter is reset. Another block B is searched in the SLC region, namely the one with the smallest deletion count.

In the starting phase, the content of B is now copied to the newly deleted block A and B is deleted. Without loss of generality, we may assume here that this deletion does not increment the wear-level class.

The logic block address LBA (A) is assigned to block B, and the latter is used as a buffer block. At the end of the write operation the logic block address LBA (X) is assigned to block B.

In the starting phase, all SLC flash chips are written to. After the starting phase, when the wear-level c is incremented, a free buffer block C with a low value of the wear-level class is searched in the MLC flash chips. This block C is deleted, the contents of block B copied to it, and the logic block address LBA (B) is assigned to block C. The logic block address LBA (C) is assigned to the deleted block A. Now block B is also deleted.

The logic block address LBA (A) is assigned to block B and the latter is used as buffer block. At the end of the write operation, the logic block address LBA (X) is also assigned to block B.

Figure 5:
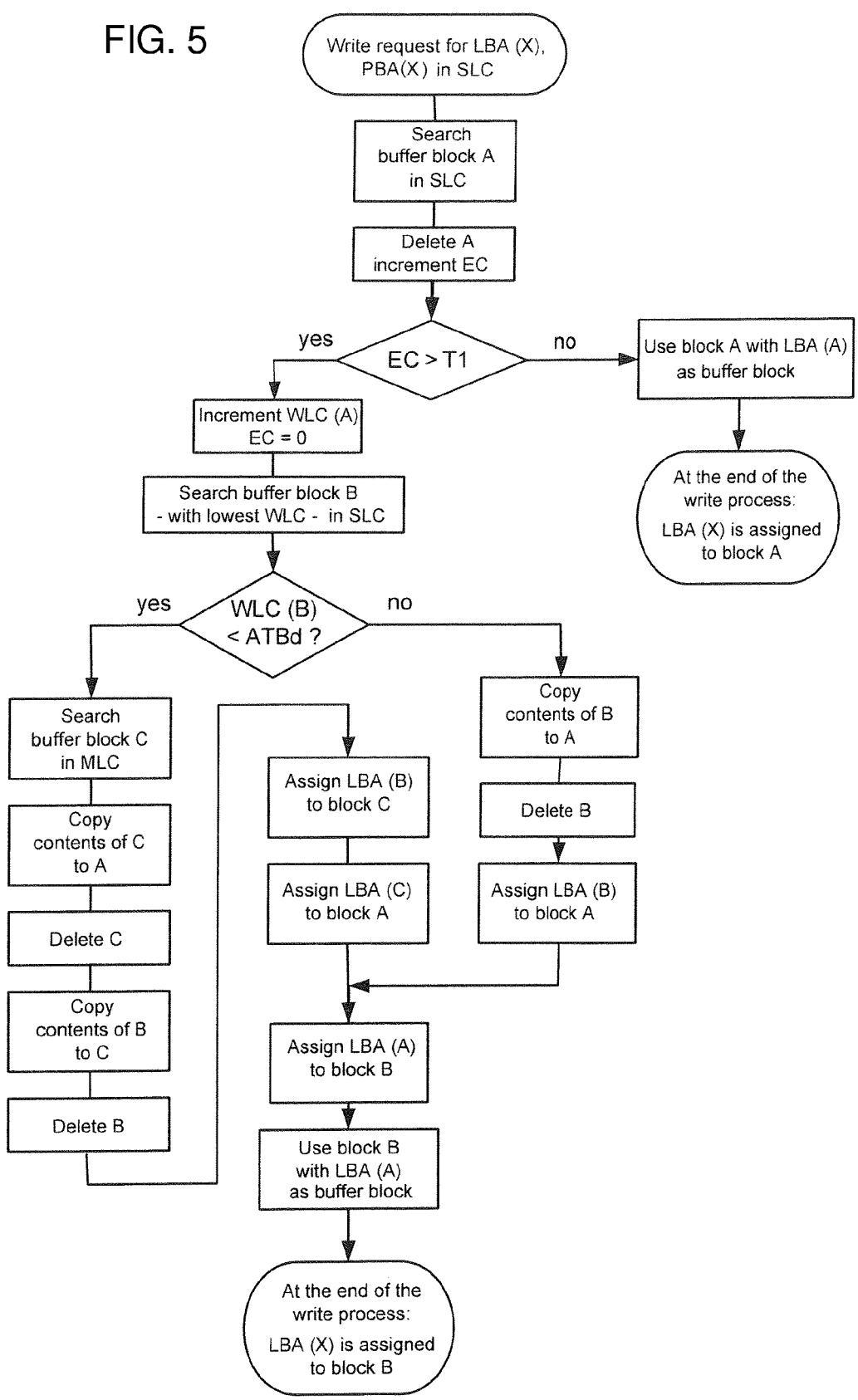
FIG. 5 shows the wear-leveling that includes moving a block to the MLC region.
Figure 6:
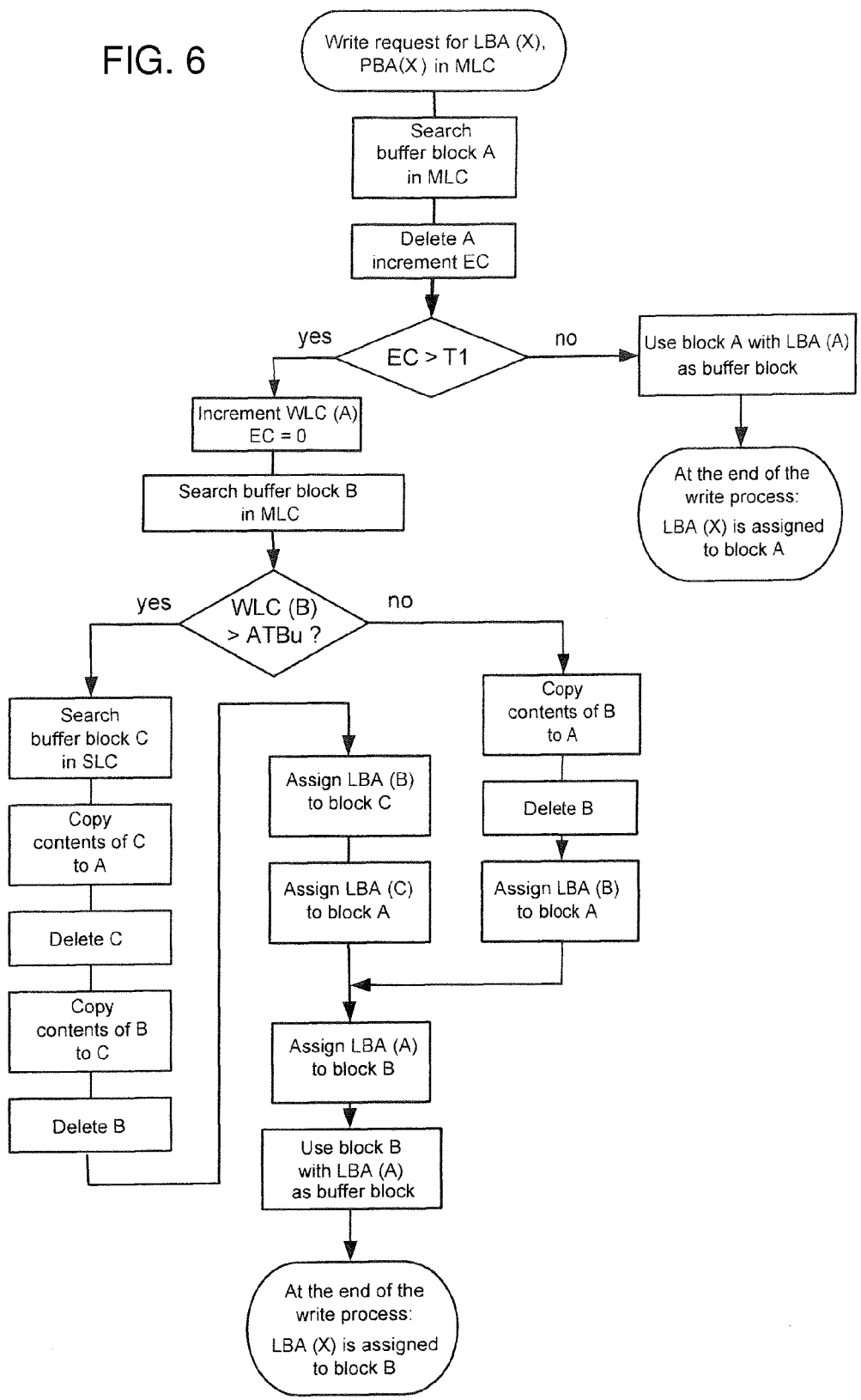
FIG. 6 shows the wear-leveling that includes moving a block to the SLC region.

In FIGS. 5 and 6, the wear-level processes are shown, switching the block that is to be written to the respectively other region. The beginning of the write process corresponds to the method according to FIG. 4.

In FIG. 5 there is a write request for the logic block address LBA (X) in the SLC region. There, a buffer block A is searched, deleted and its deletion counter EC incremented. If the deletion counter of A does not exceed the threshold T1 for the incrementation of the wear-level class, block A is used as a buffer block and the logic block address (X) assigned to block A.

When the deletion counter of A now exceeds the threshold T1 for incrementing the wear-level class, it is incremented and the deletion counter reset. Another block B is searched in the SLC region.

Now it is checked whether the wear-level class of block B is less than a predetermined threshold ATBd, in which case a shift of blocks from the SLC region to the MLC region is performed. If it does not come below this threshold, the contents of block B are copied to the deleted block A, and block B is deleted. The logic block address LBA (A) is assigned to block B, and the latter is used as a buffer block. At the end of the write operation, the logic block address LBA (X) is assigned to block B.

If the wear-level class comes below the threshold ATBd, a free buffer block C with a low value of the wear-level class is searched in the MLC flash chip. The contents of block C are copied to block A, and then block C is deleted. The contents of block B are copied to block C and B is deleted. The logic block address LBA (B) is assigned to block C and the logic block address LBA (C) is assigned to the deleted block A.

The logic block address LBA (A) is assigned to block B, and it is used as a buffer block. At the end of the write process, the logic block address LBA (X) is now assigned to block B.

FIG. 6 shows the same wear-leveling process as FIG. 5, with a shift of a block C from the MLC region to the SLC region. There is a write request for a block in the MLC region. When the wear-level class of the buffer block B in the MLC region is by one class higher than the threshold ATBu for the shift from the MLC region in the SLC region, its contents are moved to the SLC region. The further process steps are the same as described for FIG. 5, but they are applied to the respectively other region.

Figure 7:
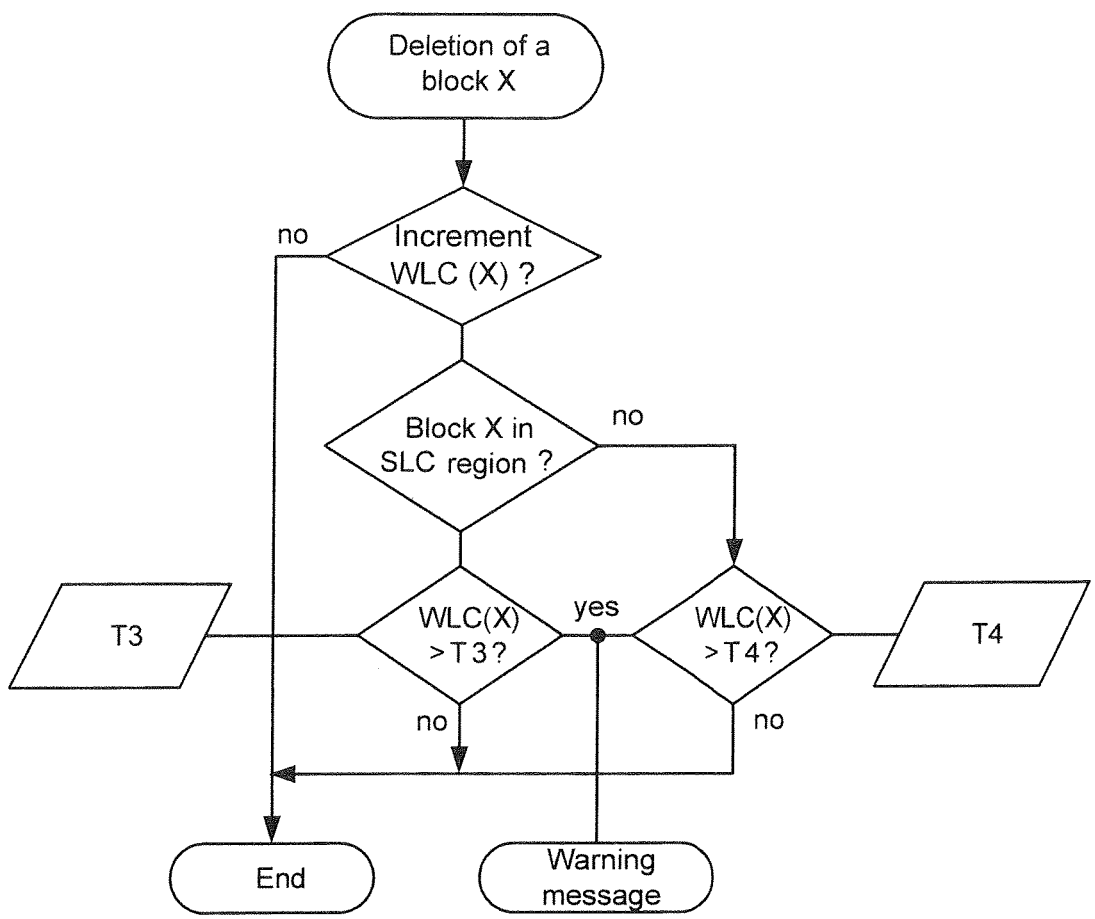
FIG. 7 shows the issuing of a warning message when nearing the maximum lifetime.

FIG. 7 shows how it is detected that the memory system is nearing its maximum lifetime, and a warning is issued.

When during the deletion of a block X the wear-level class WLC is incremented, it is checked, in which region the block is situated. If it is located in the SLC region, the wear-level class WLC is compared with an SLC-threshold T3. If the value is higher than the threshold T3, a warning is issued. This can be done, for example, using the SMART method known for hard drives.

If block X is located in the MLC region, the wear-level class is compared with a WLC threshold T4. If the value is higher than the threshold T4, also a warning is issued. In this way, the fact that the storage system is nearing its maximum lifetime can easily be noticed by the user.

REFERENCES

A, B, C, X physical blocks
AT address table
ATBu threshold for shift to SLC region
ATBd threshold for shift to MLC region
B1 first region
B2 second region
BB1 buffer blocks in first region
BB2 buffer blocks in second region
BEF deletion frequency of the block
CRC parity word
CS computer system
EC deletion counter
ECC error correction word
FC flash chip
FS flash memory
HB host bus
LBA logic block address
MB memory
MC memory controller
MLC multi-level cell memory
MS memory system
m number of sectors storage
n number of logic block addresses
PB physical block
PBA physical block address
SLC single-level cell memory
S1, Sm sectors in the block
T1 . . . T4 thresholds for deletion counter
UD user data
WLC wear-level class

The invention claimed is:

1. A method for managing a flash memory, which comprises the steps of:
    providing a plurality of flash chips forming the flash memory and organized in a plurality of physical blocks that can be deleted separately, the physical blocks having a limited maximum deletion frequency, the physical blocks being addressed by way of logic block addresses are converted into physical block addresses by way of an address table, wherein in each physical block a deletion counter is run in which a number of deletions of the physical block is counted, the flash memory having two regions with different types of the flash chips including a first region containing single-level flash chips having a large maximum deletion frequency, and a second region having multi-level flash chips having a lower maximum deletion frequency than said first region;
    when writing to the flash memory, initially carrying out an address conversion of logic addresses into physical addresses such that all the physical blocks of the first region are written;
    when all the physical blocks of the first region have been written and a further write process is to be carried out, copying the physical block in the first region having a lowest deletion counter into a blank physical block in the second region;
    in the address table, switching the physical block addresses assigned to the logic block addresses of these physical blocks; and
    deleting the physical block in the first region and the physical block is written with new data.

2. The method according to claim 1, wherein in both the first and second regions deleted buffer blocks are designated, into which further new data is written for the physical blocks that have already been written.

3. The method according to claim 2, which further comprises:
    after writing new data of the physical block to a buffer block, assigning the physical address of the physical block to the logic block address in the address table; and
    deleting a previous block and its deletion counter is incremented.

4. The method according to claim 1, which further comprises defining a wear-level threshold for each of the first and second regions.

5. The method according to claim 4, wherein for each physical block a wear-level class counter is run, which is incremented when a deletion counter attains a wear-level threshold valid for the physical block, and the deletion counter is set to 0.

6. The method according to claim 4, wherein, during a search for a buffer block, a deleted block with a low value of the wear-level class counter is searched in a same region of the flash memory.

7. The method according to claim 4, wherein for a transition from the first region, in the second region a downward threshold is defined, and for the transition from the second region to the first region an upward threshold is defined.

8. The method according to claim 7, wherein for the first region the downward threshold is determined as a highest current value of the wear-level class counter in the second region, and that for the second region the upward threshold is determined as a lowest current value of the wear-level class counter in the first region.

9. The method according to claim 7, wherein, when the wear-level class counter in the first region is incremented, it is checked whether the wear-level class counter comes below the downward threshold and if this is the case, a buffer block in the second region is used.

10. The method according to claim 7, wherein, when the wear-level class counter in the second region is incremented, it is checked whether the wear-level class counter exceeds the upward threshold and if this is the case, a buffer block in the first region is used.

11. The method according to claim 1, which further comprises when writing the data, forming an error correction word across the data and storing the error correction word in the physical block, and forming a parity word across a content of the physical block and storing the parity word.

12. The method according to claim 11, wherein upon an occurrence of multiple errors while reading from a physical block, a wear-level process is performed immediately for the physical block.

13. The method according to claim 1, wherein for the first and the second regions respectively, a maximum of permitted deletions of the physical blocks is set and, when wear-level class counters are incremented, their current value is compared with set values and, if a maximum of permitted deletions is attained, a warning is issued.

* * * * *